United States Patent
Morovic et al.

(10) Patent No.: US 10,252,513 B2
(45) Date of Patent: Apr. 9, 2019

(54) COMBINING STRUCTURES IN A THREE-DIMENSIONAL OBJECT

(71) Applicant: Hewlett-Packard Development Company, L.P., Houston, TX (US)

(72) Inventors: Peter Morovic, Sant Cugat del Valles (ES); Jan Morovic, Colchester (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/545,264

(22) PCT Filed: Apr. 28, 2015

(86) PCT No.: PCT/EP2015/059217
§ 371 (c)(1),
(2) Date: Jul. 20, 2017

(87) PCT Pub. No.: WO2016/173630
PCT Pub. Date: Nov. 3, 2016

(65) Prior Publication Data
US 2018/0086045 A1  Mar. 29, 2018

(51) Int. Cl.
*G06F 15/00* (2006.01)
*B33Y 50/02* (2015.01)
(Continued)

(52) U.S. Cl.
CPC .............. *B33Y 50/02* (2014.12); *H04N 1/405* (2013.01); *B29C 64/386* (2017.08); *G06F 17/50* (2013.01)

(58) Field of Classification Search
CPC .................................. B33Y 50/02; H04N 1/405
(Continued)

(56) References Cited

U.S. PATENT DOCUMENTS

| 5,956,157 A | 9/1999 | Tai |
| 7,079,287 B1 | 7/2006 | Ng et al. |

(Continued)

OTHER PUBLICATIONS

Cho et al., "A dithering algorithm for local composition control with three-dimensional printing", vol. 35, No. 9, Aug. 1, 2003, pp. 851-867.

(Continued)

*Primary Examiner* — Mark R Milia
(74) *Attorney, Agent, or Firm* — HP Inc. Patent Department

(57) ABSTRACT

Certain examples described herein relate to the use of three-dimensional threshold matrices in the production of three-dimensional objects. In one case, data values for a three-dimensional matrix for use in halftoning are assigned based on a structural volume coverage representation. In certain described cases, the structural volume coverage representation defines a probabilistic distribution of at least two different structures available for the production of the three-dimensional object. A convex combination of the at least two different structures is determined, based on data values of the structure volume coverage representation. A data value may be assigned to the three-dimensional matrix based on the convex combination determined. The resultant three-dimensional matrix is used in a halftoning operation to control a structure distribution in the three-dimensional object.

15 Claims, 4 Drawing Sheets

(51) Int. Cl.
*H04N 1/405* (2006.01)
*G06F 17/50* (2006.01)
*B29C 64/386* (2017.01)

(58) Field of Classification Search
USPC .......................................................... 358/3.06
See application file for complete search history.

(56) References Cited

U.S. PATENT DOCUMENTS

| | | | |
|---|---|---|---|
| 7,079,290 B2 * | 7/2006 | Crossland | H04N 1/4055 358/3.13 |
| 7,212,315 B2 | 5/2007 | Huang et al. | |
| 2010/0290089 A1 | 11/2010 | Stevens | |
| 2011/0012919 A1 | 1/2011 | Tai et al. | |
| 2011/0235127 A1 | 9/2011 | Yamaguchi | |
| 2013/0027752 A1 | 1/2013 | Park et al. | |
| 2014/0277661 A1 | 9/2014 | Amadio et al. | |
| 2014/0324204 A1 * | 10/2014 | Vidimce | B29C 67/0088 700/98 |

OTHER PUBLICATIONS

International Search Report and Written Opinion dated Jan. 20, 2016, PCT Patent Application No. PCT/EP2015/059217, filed Apr. 28, 2015, European Patent Office.

Jonathan Hillier et al., "Tunable Material Propertiesfor 3D Voxel Printers", Sep. 10, 2008, pp. 33-44.

Seong Jun Park, et al., "Halftone blending between smooth and detail screens to improve print quality with electrophotographic printers", Jan. 24, 2012. http://proceedings.spiedigitallibrary.org/proceeding.aspx?articleid=1345521#.

Siu Y K et al., "Modelling the material grade and structures of heterogeneous objects for layered manufacturing", vol. 34, No. 10, Sep. 1, 2002, pp. 705-716.

* cited by examiner

COMBINING STRUCTURES IN A THREE-DIMENSIONAL OBJECT

CLAIM FOR PRIORITY

The present application is a national stage filing under 35 U.S.C. § 371 of PCT application number PCT/EP2015/059217, having an international filing date of Apr. 28, 2015, the disclosure of which is hereby incorporated by reference in its entirety.

BACKGROUND

Apparatus that generate three-dimensional objects, including those commonly referred to as "3D printers", have been proposed as a potentially convenient way to produce three-dimensional objects. These apparatus typically receive a definition of the three-dimensional object in the form of an object model. This object model is processed to instruct the apparatus to produce the object using at least one production material. These production materials may comprise a combination of agents and powdered substrates, heated polymers and/or liquid solutions of production material. The processing of an object model may be performed on a layer-by-layer basis. It may be desired to produce a three-dimensional object with at least one property, such as color, mechanical and/or structural properties. The processing of the object model may vary based on the type of apparatus and/or the production technology being implemented. Generating objects in three-dimensions presents many challenges that are not present with two-dimensional print apparatus.

BRIEF DESCRIPTION OF THE DRAWINGS

Various features of the present disclosure will be apparent from the detailed description which follows, taken in conjunction with the accompanying drawings, which together illustrate, by way of example, features of the present disclosure, and wherein.

DETAILED DESCRIPTION

Figure 1:
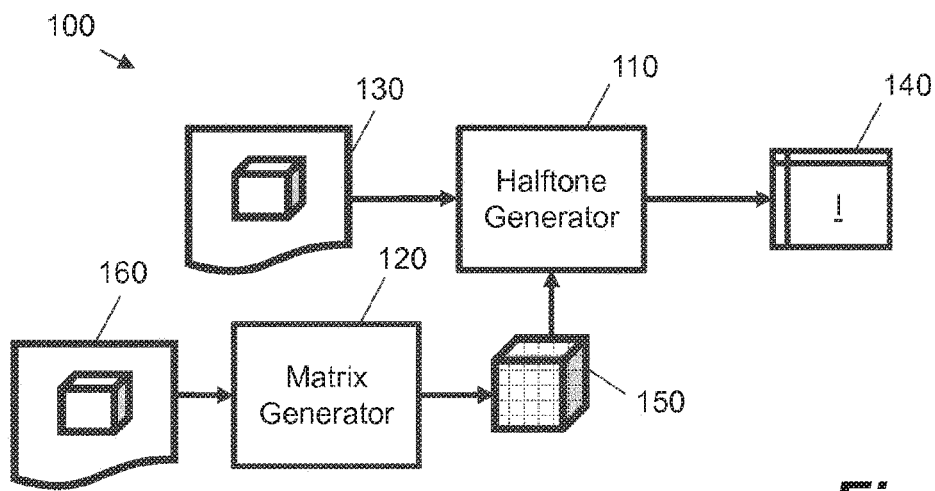
FIG. 1 is a schematic diagram showing an apparatus for generating control data for production of a three-dimensional object according to an example.

In the production of three-dimensional objects, e.g. in so-called "3D printing", there is a challenge to control the structure of generated objects. For example, it may be desired to produce objects with a variety of structural properties, which may influence, or be influenced by, material properties and/or mechanical properties of a produced object. There is also a desire to flexibly control the structure of produced objects. In certain cases, it may be desired to vary a structure of at least one part of an object model without having to re-design or re-generate the object model. Furthermore, it may be desired to produce smooth, controlled transitions between different predetermined structures of different parts of the object model. For example, a first structure may be defined for a first object part, and a second structure may be defined for a second object part. For a transition region between the two parts, a seamless blending of the two structures may be desired. As may be appreciated, such considerations are not present with conventional two-dimensional printing.

Certain examples described herein enable a three-dimensional matrix to be generated for use in a halftone thresholding operation. A structural volume coverage representation is obtained. The structural volume coverage representation is defined with reference to at least one volume element corresponding to at least a portion of the three-dimensional object. The structural volume coverage representation comprises data values defining a probabilistic distribution of at least two predefined structures available for the production of the three-dimensional object. The structural volume coverage representation may be based on a transition function predefined between the positions of at least two further volume elements of the three-dimensional object, e.g. data values of the structural volume coverage representation may represent intermediate values determined according to a gradient between data values at two selected positions.

In certain described examples, a convex combination of the at least two predefined structures is determined for the at least one volume element. The convex combination may be based on at least one of said data values of the structure volume coverage representation. Based on the convex combination determined, a halftone value is then assigned to at least one corresponding volume element of a three-dimensional matrix for use in a halftone threshold operation. The halftone value may indicate a calculated structure comprising at least a portion of at least one of said predefined structures. The three-dimensional matrix in these examples is thus generated from these assigned halftone values. The three-dimensional matrix may then be applied to a digital representation of an object to be produced, e.g. in a halftone thresholding operation, to generate control data for use in producing the object. For example, the output of the halftone thresholding operation may comprise deposit or material formation instructions for an additive manufacturing system. By controlling the form of the three-dimensional matrix used for thresholding, the three-dimensional structure of a three-dimensional object may be controlled. Furthermore, by generating the three-dimensional matrix based on a probabilistic distribution of available predefined structures for each volume element, a mechanism of smooth structural blending at the halftone level may be operated. In this sense, "smooth" may be defined as a continuous change or an approximation to a continuous change, e.g. where differences between subsequent data values are below a predefined threshold value. Moreover, by generating the three-dimensional matrix based on convex combinations of available predefined structures, a blended structure may result that is different from any of the various predefined structures at the level of individual printed voxels. The mechanism in these examples may be operated for an entire three-dimensional object, or for at least one transition region of the three-dimensional object. A transition region may be defined as a region positioned between at least two object parts having different predefined structures. Within the transition region, a smooth transition of structure may be obtained at the halftone level.

Certain examples described here enable a three-dimensional object with a desired blend of structures to be produced without modifying a substantial portion of an object processing pipeline. These examples also reduce the need for specific choices to be made during the design of the object, e.g. volumes or object models of the designed object need not exhibit the desired blend of structures when the object is sent for production. This is achieved by allowing choices associated with the structural blend of the object to be made at a stage in an object processing pipeline after design yet before production of the object, e.g. such as when a designed object is submitted as a "3D print job". The same object may therefore be produced with a variety of different structures, substructures and/or structural blends. The specific structural blend used for object production may vary depending on at least one of: a predefined gradient function, object geometry and at least two predefined structures. In certain cases, a rasterized version of the object design that specifies material use for volumes of the object (e.g. voxels) is halftoned using a three-dimensional matrix that is generated at or near production time based on a desired structural blend.

FIG. 1 shows an example of an apparatus 100 arranged to generate control data for the production of a three-dimensional object. The apparatus 100 comprises a halftone generator 110 and a matrix generator 120. The halftone generator 110 is arranged to receive data 130 defining the three-dimensional object and to output discrete instructions 140 for at least one production material. These may comprise deposit instructions, e.g. for the deposit of at least one agent onto a powdered substrate or for the deposit of an extruded polymer, and/or material formation or arrangement instructions, e.g. control instructions for guiding a laser device to heat a liquid or solid material. To generate the instructions 140 the halftone generator 110 can process the data 130 in association with a three-dimensional threshold matrix 150. In certain cases this may comprise comparing at least a portion of the data 130 to a corresponding portion of a three-dimensional threshold matrix 150 or an equivalent operation. In one case, the halftone generator 110 can perform a halftone thresholding operation on a material-use value associated with a volume of the data 130, such as a voxel, using a halftone threshold value retrieved from a location in the three-dimensional threshold matrix 150 that corresponds to that volume. In an additive manufacturing system with a bi-level deposit mechanism, this may comprise outputting deposit instructions in the form of "deposit material" (e.g. "1") or "do not deposit material" (e.g. "0"). For example, if a material-use value for a given voxel was 65% and the retrieved halftone threshold value was 50% then as the material-use value is above the threshold value a deposit instruction of "1" may be output for the given voxel. This may be actuated as a deposit of the production material at an output location corresponding to the given voxel. In certain systems, the output may comprise one of a set of material formation states for a given volume of the three-dimensional object at a production resolution, e.g. a volume of an output object that is addressable using an additive manufacturing system and whose output material state may be modified by selective actions of the system.

In the example of FIG. 1, the matrix generator 120 can generate the three-dimensional threshold matrix 150 for use by the halftone generator 110. To do this the matrix generator 120 can obtain a structural volume coverage representation 160. The structural volume coverage representation 160 is defined with reference to at least one volume element corresponding to the three-dimensional object. For example, the structural volume coverage representation 160 may be defined in relation to at least one voxel of a digital representation of the three-dimensional object. Furthermore, the structural volume coverage representation 160 comprises data values defining a probabilistic distribution of at least two different predefined structures available for the production of the three-dimensional object. The matrix generator 120 can determine, for the at least one volume element, a convex combination of the at least two predefined structures based on at least one of said data values of the structure volume coverage representation 160. The matrix generator 120 is further arranged to assign a data value to at least one corresponding volume element of the three-dimensional threshold matrix 150 based on the convex combination determined. In this manner, values of the three-dimensional threshold matrix 150 are selected, wherein the three-dimensional threshold matrix 150 may be applied by the halftone generator 110 to effect a particular structure through the control of the generation of the discrete material formation instructions 140. An object produced by an additive manufacturing system according to the discrete material formation instructions 140 thus demonstrates structural features that are dependent on the values of the three-dimensional threshold matrix 150.

According to various examples, the at least two predefined structures 160 may comprise two different halftone threshold matrices, e.g. at least two different three dimensional threshold matrices. These threshold matrices may be based on at least one of the following threshold matrices: a void-and-cluster matrix; an amplitude modulation (AM) matrix, such as a cluster-dot matrix; an organic lattice type matrix; and a noise matrix having a predefined color, such as a white noise matrix with uniform random noise or a green noise matrix (e.g. using mid-frequency noise components). The different structures may be based on lattices of different cell size, according to one example. In one case, each structure may be effected by the values of the corresponding halftone threshold matrix. The halftone threshold matrices corresponding to each structure may, in one example, each be of the same dimensionality and/or size.

In one example, the structural volume coverage representation 160 may comprise at least one structural volume coverage vector. The structural volume coverage vector may have at least two vector components corresponding to at least two different structures. In one case, the structural volume coverage vector may represent a proportional volumetric coverage of at least two different structural matrices. For example, in a simple case, a structural volume coverage vector may comprise two vector components $[S_1, S_2]$, wherein each vector component is a probability value from 0 to 1 (or a percentage from 0% to 100%). In this case, $S_1$ may relate to a first structure that has a given halftone threshold matrix $SM_1$. Similarly, $S_2$ may relate to a second structure that has a given halftone threshold matrix $SM_2$. The structural volume coverage vector may correspond to at least a first volume element in a set of volume elements, e.g. a voxel in a set of voxels according to a particular three-dimensional resolution.

In one case, the matrix generator 120 may be arranged to obtain data values for the at least two vector components in the structural volume coverage vector based on a determined transition behavior among the at least two different structures. The transition behavior may be determined for a position associated with a given volume element. In one example, the transition behavior may be determined based on a transition function predefined between the positions of at least two further volume elements. These further volume elements may comprise vertices of the three-dimensional object and/or particular points in the object property geometries of the three-dimensional object, e.g. positions with particular object property values. The transition behavior may be applied to values of halftone threshold matrices associated with each structure, e.g. values of $SM_1$ and $SM_2$ as discussed above. In one case, the transition behavior may represent a gradient between values of vertices of halftone threshold matrices. The transition behavior may, according to one example, be based on a determined distance of the position of the given volume element from the positions of the at least two further volume elements. In one case, the transition behavior may be based on a set of barycentric coordinates relative to a set of the at least two further volume elements. In one example, the transition behavior may be based on a set of barycentric coordinates relative to a set of four further volume elements, e.g. vertices of a simplex in three-dimensions. The transition behavior may, in some cases, be defined explicitly, e.g. by a transition matrix. In other cases, the transition behavior may be defined functionally, e.g. based on a logarithmic or linear transitioning function between vertices of a cube. In examples described herein the transition behavior is effected such that values for the at least two vector components are convex, e.g. that they sum to unity.

In one case, a transition function may be applied to data values associated with the at least two further volume elements that are themselves indicative of a volume coverage. In one case, this may be a structural volume coverage representation comprising only one of the at least two different structural matrices. In other words, a structural volume coverage vector for the at least two further volume elements may indicate a 100% coverage for one of the available structures and a 0% coverage for the remaining available structures. In one example, the structural volume coverage vector for one further volume element may indicate a 100% coverage for a first available structure, and the structural volume coverage vector for another further volume element may indicate a 100% coverage for a second available structure. The at least two further volume elements may therefore represent extreme positions, between which a transition region exists. At each extreme position, one of the available structures may be defined with 100% volumetric coverage. Volume elements in the transition region may have a structural volume coverage comprising nonzero probabilities for at least two available structures.

In one example, each structural volume coverage vector may be associated with a series of unit volumes referred to herein as "voxels", in a similar manner to the way in which a two-dimensional image is divided into unit areas referred to as "pixels". In one case, cubic volumes may be used with a common value for each of the height, width and depth of a voxel. In other cases, custom unit volumes or voxels may be defined, e.g. where the unit volume is non-cubic and/or has values of height, width and depth that differ from each other with (although each voxel has the same height, width and depth as other voxels in the raster representation). In certain cases, the unit volume or voxel may be a non-standard or custom-defined three-dimensional shape, e.g. voxels may be based on Delaunay tessellations (e.g. tetrahedra that fill the object) or any other space-filling polyhedra. In this case, the structural volume coverage representation may be stored as a set of tuples (e.g. in an array-type structure) with one component of the tuple representing a voxel co-ordinate in three dimensions (e.g. a centroid or bottom corner) and another component of the tuple representing a structural volume coverage vector.

In one implementation, the data 130 comprises at least one material volume coverage vector for at least one volume of the three-dimensional object. A material volume coverage vector represents a probabilistic distribution of materials available to an additive manufacturing system for production of the three-dimensional object. In one case, each vector represents a proportional volumetric coverage of materials available for production of the three-dimensional object and combinations of said materials. For example, for k materials available for production of the three-dimensional object and L discrete material formation states for said materials, the material coverage vector comprises $L^k$ vector components, each vector component having an associated probability value. In this case, the discrete deposit instructions comprises production instructions from a set of L*k available instruction values, each element at a production resolution having one of L material formation state instructions for each of said k materials. The materials and material combinations defined by the material volume coverage vector may be associated with a number of different material types, e.g. build materials, finishing materials, support or scaffolding materials, agents and powders, including separate use of materials, joint use of materials, and an absence of any materials.

To explain the components of a material volume coverage vector, a simple example may be considered. In this simple example, an apparatus can use two materials to generate a three-dimensional object: M1 and M2. These may be fluid build materials that are deposited on a substrate or platen, e.g. excreted or ejected molten polymers, or they may comprise two deposit-able colored agents that are deposited on at least one layer of powdered build material. In the latter case, in a produced three-dimensional object, each "material" may correspond to a cured combination of the deposit-able agent and a powdered build material. In the former case, in a produced three-dimensional object, each "material" may correspond to a solidified portion of excreted or ejected polymer. In any case, each "material" is deposit-able by an additive manufacturing apparatus to generate a defined volume (e.g. at the production resolution) of an output three-dimensional object.

In this simple example, if the additive manufacturing apparatus can deposit discrete amounts of each material, e.g. in binary deposits, there are four different material combination states: a first state for the deposit of M1 without M2; a second state for the deposit of M2 without M1, a third state for the deposit of both M1 and M2, e.g. M2 deposited over M1 or vice versa; and a fourth state for an absence of both M1 and M2, e.g. "blank" (Z) or an inhibitor. In this case, the material volume coverage vector has four vector components: [M1, M2, M1M2, Z]. In the case of the last vector component, "blank" or "Z" may represent "empty" or an absence of materials in a processed layer, e.g. if agents are deposited on layers of build material this may denote an absence of build material for the processed layer, even though the build material may not be removed until the complete object has been produced.

In one case, the apparatus 100 may be implemented as part of an additive manufacturing system, e.g. may comprise electronics or portions of an embedded controller for a "3D printer". In another case, at least one portion of the apparatus 100 may be implemented as executable code, stored on a non-transitory storage medium, that includes instructions, that when executed by at least one processor, causes the processor to perform the functionality of the at least one portion of the apparatus 100 described herein. This executable code may additionally access data from at least one volatile or non-volatile memory, such as random access memory, read-only memory and/or hard disk drives. The at least one processor may form part of an additive manufacturing system (e.g. a computing module of a "3D printer") and/or may form part of a computer device communicatively coupled to the additive manufacturing system (e.g. a desktop computer configured to control a "3D printer" and/or a "3D print driver" installed on the computer device). In one case, the computer device may comprise a server communicatively coupled to an additive manufacturing system; e.g. a user may submit the data 130 defining the three-dimensional object from a mobile computing device for processing by the apparatus 100 "in the cloud", the apparatus 100 may then send the material formation instructions 140 to an additive manufacturing system via a network communications channel. In one case, at least one portion of the apparatus 100 may be implemented as at least one application-specific integrated circuit (ASIC). The ASIC may be standard, fully customized or partially customized. In one example, the ASIC may have a structured design. The ASIC may comprise at least one microprocessor and/or at least one memory block. In another example, the ASIC may comprise at least one gate array, e.g. a field-programmable gate array. The field-programmable gate array may comprise an array of programmable logic blocks and a hierarchy of reconfigurable interconnects. The array of programmable logic blocks may, in certain examples, comprise memory elements, e.g. flip-flops. The ASIC may, in one example, be arranged to receive the data 130 defining the three-dimensional object. The ASIC may be communicatively coupled to at least one central processing unit, according to one example. The data 130 may be accessed by the at least one central processing unit. The at least one central processing unit may comprise at least one of a general-purpose central processing unit and a specific-purpose central processing unit. The ASIC and/or the central processing unit may be arranged to operate at least one of the halftone generator 110 and the matrix generator 120, according to certain examples.

Figure 2:
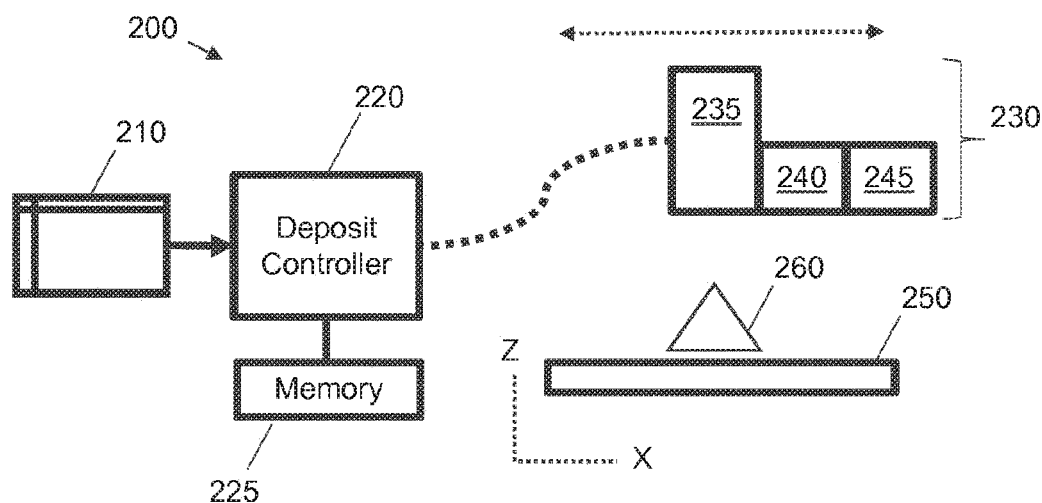
FIG. 2 is a schematic diagram showing an apparatus for production of a three-dimensional object according to an example.

An example of an apparatus arranged to produce a three-dimensional object according to the material formation instructions 140 will now be described with reference to FIG. 2. FIG. 2 shows an example of an apparatus 200 arranged to produce a three-dimensional object 260. The apparatus 200 can receive data 210 for the three-dimensional object, which may comprise material formation instructions 140 as described below. In one case, at least one portion of the apparatus 200 may be implemented as executable code, stored on a non-transitory storage medium, that includes instructions, that when executed by at least one processor, causes the processor to perform the functionality of the at least one portion of the apparatus 200 described herein. Apparatus 200 is shown and described for better understanding of the presently described examples; other apparatus of a different form and/or using a different technology may alternatively be used with the structural volume coverage representations described herein.

In FIG. 2, the apparatus 200 comprises a deposit controller 220 and a memory 225. The deposit controller 220 may comprise at least one processor that forms part of an embedded computing device, e.g. adapted for use in controlling an additive manufacturing system. Memory 225 may comprise volatile and/or non-volatile memory, e.g. a non-transitory storage medium, arranged to store computer program code, e.g. in the form of firmware. Firmware may comprise machine readable instructions and/or executable code that comprises instructions for at least one processor. The deposit controller 220 is communicatively coupled to aspects of the apparatus that are arranged to construct the three dimensional object. These comprise a deposit mechanism 230. The deposit mechanism 230 can deposit production materials to generate the three-dimensional object. In the present case, the deposit mechanism comprises a substrate supply mechanism 235 and an agent ejection mechanism 240, 245. In other cases the deposit mechanism 230 may comprise fewer or additional components, e.g. a substrate supply mechanism may be provided separately from the agent ejection mechanism or omitted, or other components, e.g. the deposit mechanism 230 may comprise a polymer extraction mechanism. In the schematic example of FIG. 2, the agent ejection mechanism 240, 245 comprise two components: a first component 240 for the supply of a first agent (e.g. material M1 as discussed above) and a second component 245 for the supply of a second agent (e.g. material M2 as discussed above). Two materials are presented in this example for ease of explanation but any number of materials may be supplied. Similar materials in the form of agents are described for example only. The substrate supply mechanism 235 can supply at least one substrate layer upon which the materials available for production are deposited by the agent ejection mechanism 240, 245 to produce the three-dimensional object 260. In the present case, the materials comprise agents that are applied to a powder substrate, wherein the combination of agent and powder, following a curing process, form part of the object. However, other implementations are possible, e.g. the materials may be deposited to form part of the object, e.g. as per the polymer case discussed above. In the example of FIG. 2, the three-dimensional object 260 is built layer by layer on a platen 250. The arrangement of the aspects and components shown in FIG. 2 are not limiting; the exact arrangement of each apparatus will vary according to the production technology that is implemented and the model of apparatus.

In the example of FIG. 2 the deposit controller 220 is configured to process and/or otherwise use the data 210 to control at least one component of the deposit mechanism 230. The deposit controller 220 may control at least one of the substrate supply mechanism 235 and the agent ejection mechanism 240, 245. For example, the discrete material formation instructions in the data 140 may be used by the deposit controller 220 to control nozzles within the agent ejection mechanism. In one implementation the apparatus 200 may be arranged to use a coalescing agent and a coalescing modifier agent that are respectively supplied by the components of the agent ejection mechanism 240, 245. These agents allow a three-dimensional object to have varying material properties. They may be combined with at least one colored powdered substrate material, e.g. applied using an inkjet mechanism to deposited powder layers, to generate multi-color objects with varying material properties. If a plurality of powdered substrate materials are available they may also form part of the "materials" of the material volume coverage vector in certain cases. In these cases the generated objects may be constructed by depositing at least the coalescing agent and the coalescing modifier agent on layers of substrate material, e.g. layers of powder or other material forming z-plane slices, followed by the application of energy to bind the material, e.g. infra-red or ultra-violet light. For example, at least one of the substrate supply mechanism 235 and the agent ejection mechanism 240, 245 may be moveable relative to the platen 250, e.g. in at least one of the x, y and z directions (wherein the y axis is into the sheet for FIG. 2). At least one of the substrate supply mechanism 235, the agent ejection mechanism 240, 245 and the platen 250 may be moveable under control of the deposit controller 220 to achieve this. Additionally, at least one ink may also be deposited on cured and/or uncured layers, wherein this ink also forms part of the "materials" of the material volume coverage vector. In other implementations the apparatus may comprise part of, amongst others, selective laser sintering systems, stereo lithography systems, inkjet systems, fused deposition modelling systems, any three-dimensional printing system, inkjet deposition systems and laminated object manufacturing systems. These include apparatus that directly deposit materials rather than those described that use various agents.

In one case, the functionality of the apparatus 100 and the deposit controller 220 may be combined in one embedded system that can receive the data 130 defining the three-dimensional object, or data useable to produce this, and control the apparatus 200 accordingly. This may be the case for a "stand alone" apparatus that can receive data 210, e.g. by physical transfer and/or over a network, and produce an object. For example, this apparatus may be communicatively coupled to a computer device that can send a "print job" comprising the object definition 130, or data useable to produce the object definition 130, to the apparatus in the manner of a two-dimensional printer.

Figure 3:
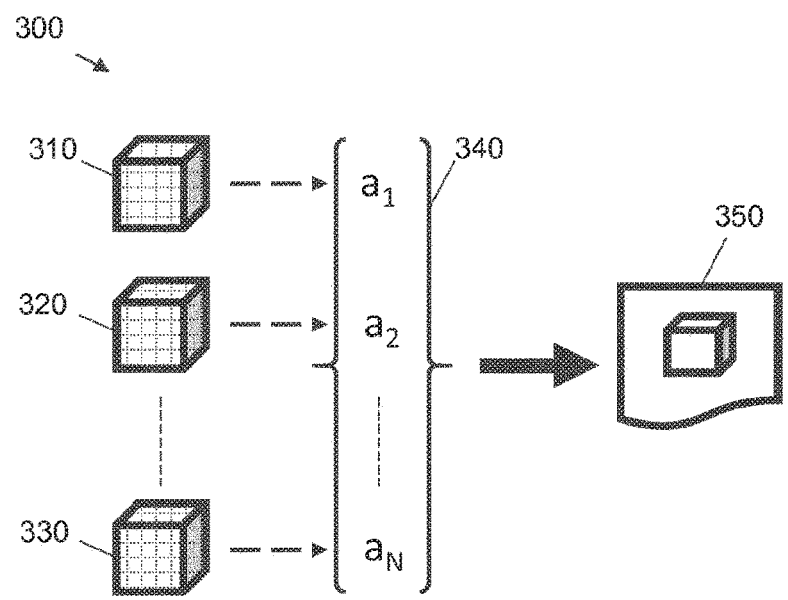
FIG. 3 is a schematic illustration showing a portion of a structural volume coverage representation useable to generate a three-dimensional threshold matrix according to an example.

FIG. 3 shows schematically a representation 300 of a structural volume coverage vector for a volume, of a three-dimensional object, according to an example. For the volume, a plurality of independent predefined structural representations are available, including at least a first structural representation 310, and a second structural representation 320. Further structural representations may additionally be available, up to and including an Nth structural representation 330. In one case, each available structural representation may have a corresponding probability of being used for a halftoning operation for the given volume. In this case, the corresponding probabilities are given by the values $a_1$, $a_2, \ldots, a_N$. For example, a structural representation may be embodied in a particular halftone threshold matrix. In the example of FIG. 3 there may be N different halftone threshold matrices. In this case, the value $a_1$ represents a probability that a first structural representation 310 is used; the value $a_2$ represents a probability that a second structural representation 320 is used; and so on up to the value $a_N$ representing a probability that an Nth structural representation 330 is used. Each structural representation may be independent, e.g. may be stored as a separate data structure comprising threshold values. Put another way, $a_1, a_2, \ldots, a_N$ may be values indicative of a proportion of the given volume that is to be represented by each of the corresponding structural representations during the halftoning operation. At least one of the values $a_1, a_2, \ldots, a_N$ may be combined to form at least part of a structural volume coverage vector 340, e.g. only one value may be used if all the other values are zero. In one example, all of the values $a_1, a_2, \ldots, a_N$ may be combined to form the structural volume coverage vector 340. The values $a_1, a_2, \ldots, a_N$ that form part of the structural volume coverage vector 340 may sum to unity. In one example, the values $a_1, a_2, \ldots, a_N$ may be derivable from a probability distribution which may be represented continuously. In a further example, the values $a_1, a_2, \ldots, a_N$ may be determined based on a predefined transition function. The structural volume coverage vector 340 may, according to certain examples, represent a continuous probability distribution, e.g. by way of particular quantized values.

According to the example shown in FIG. 3, the structural volume coverage vector 340 forms at least part of a structural volume coverage representation 350. In one example, the structural volume coverage representation may comprise a single structural volume coverage vector 340. In another example, the structural volume coverage representation may comprise a plurality of structural volume coverage vectors 340. The number of structural volume coverage vectors 340 forming part of the structural volume coverage representation 350 may correspond to the number of volumes defined for the three-dimensional object. For example, a structural volume coverage vector may be defined for each of a plurality of voxels in a rasterized digital representation of a three-dimensional object. In another case, a plurality of structural volume coverage vectors may be defined in relation to a respective plurality of volumes of the three-dimensional object, e.g. representative of different parts of the three-dimensional object. Volume elements in this latter case may then be defined geometrically, e.g. as a volume enclosed by a plurality of points. The structural volume coverage representation 350 may, according to one example, comprise other information, data and/or representations in addition to the at least one structural volume coverage vector 340.

Figure 4:
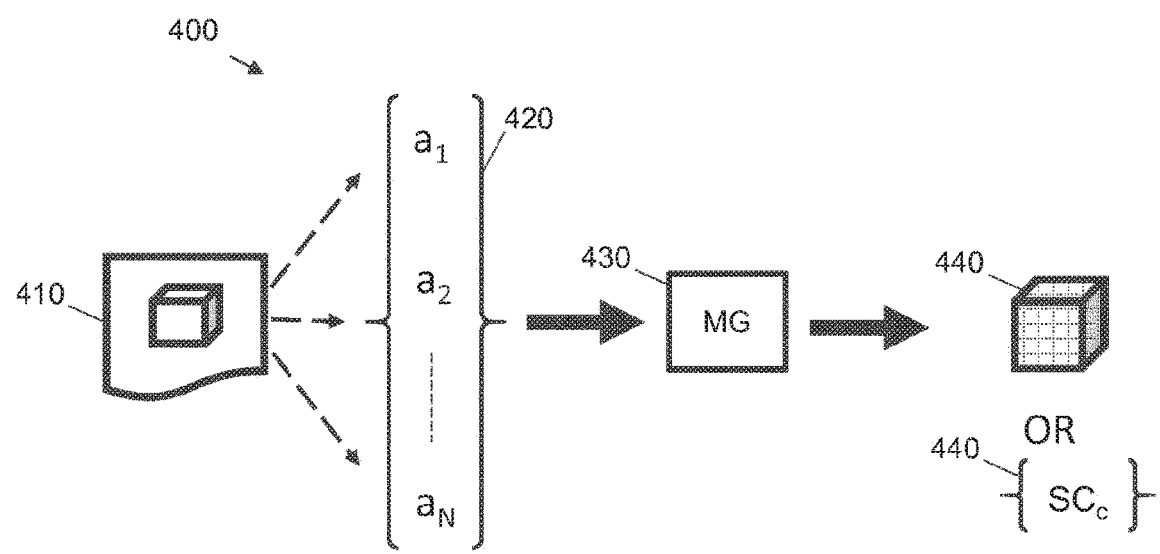
FIG. 4 is a schematic illustration showing an operation performed on a portion of a structural volume coverage representation to generate a three-dimensional matrix according to an example.

FIG. 4 shows a schematic representation of an operation 400 performed on a portion of a structural volume coverage representation 410 to generate a three-dimensional matrix according to an example. The structural volume coverage representation 410 comprises at least one structural volume coverage vector 420 for a given volume. The volume may be defined in association with a plurality of co-ordinates in three-dimensional space. The co-ordinates may be defined according to a grid resolution in x, y and z dimensions, e.g. may comprise the centers or corners of volumes defined according to a predetermined resolution or set of discrete values in each of the x, y and z dimensions. The structural volume coverage vector 420 has N components, each corresponding to a probability $a_i$ associated with one of N structural matrices, as described in accordance with the example shown in FIG. 3. The structural volume coverage vector 420 is obtained by a matrix generator 430. In the present example, the matrix generator 430 determines a convex combination of the at least two structural matrices. Based on said convex combination, a value 440 is assigned to the three-dimensional matrix. The value 440 may correspond to a calculated structure, for the given volume, the calculated structure comprising at least a portion of one of said structural matrices.

In certain examples, a value may be assigned to the three-dimensional matrix for every structural volume coverage vector obtained by the matrix generator 430, e.g. a resultant three-dimensional halftone threshold matrix such as 150 in FIG. 1 may be produced at the same resolution as the structural volume coverage representation. In other cases, a resultant three-dimensional halftone threshold matrix may be generated at a different resolution to the structural volume coverage representation, e.g. by mapping a value generated based on a single structural volume coverage vector to multiple volumes in the resultant three-dimensional halftone threshold matrix or by combining values for multiple structural volume coverage vectors.

Figure 5:
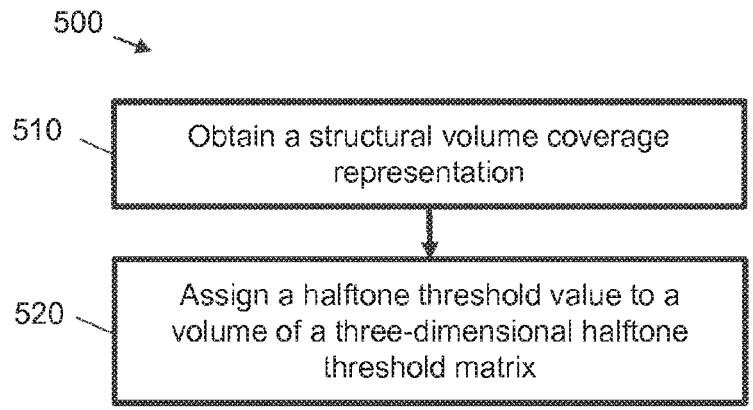
FIG. 5 is a flow diagram showing a method for generating a three-dimensional halftone threshold matrix according to an example.

FIG. 5 shows a method 500 for generating a three-dimensional halftone threshold matrix for use in production of a three-dimensional object according to an example. This method may be applied by any one of apparatus 100 and deposit controller 220, by another additive manufacturing system or by a computer device arranged to control an additive manufacturing system. At block 510, a structural volume coverage representation for the three-dimensional object is obtained. The structural volume coverage representation comprises a structural volume coverage vector for at least one volume of the three-dimensional object. The structural volume coverage vector represents a proportional volumetric coverage of at least two different predefined structural matrices. At block 520, a halftone threshold value is assigned to a corresponding volume of a three-dimensional halftone threshold matrix. The halftone threshold value corresponds to at least a portion of at least one of said predefined structural matrices. The halftone threshold value is assigned based on a weighted combination of the at least two predefined structural matrices. This weighted combination may be a convex combination as described above, e.g. where all the weights that are applied sum to one. The resultant three-dimensional halftone threshold matrix from the method 500 is applicable to an object definition for at least a portion of the three-dimensional object to instruct production of at least the portion of the three-dimensional object, e.g. by halftoning a digital object representation of at least the portion of the three-dimensional object. In particular, assigned halftone threshold values may be used for application to a section of a digital representation corresponding to a layer of the three-dimensional object.

In one case, the method 500 comprises obtaining the aforementioned digital representation for at least the portion of the three-dimensional object; halftoning the digital representation using the three-dimensional halftone threshold matrix to generate control data for production of at least the portion of the three-dimensional object; and producing at least the portion of the three-dimensional object on an additive manufacturing system using the generated control data. In this case, the halftoning may be performed after a design stage yet before a print stage, e.g. near the end of, or late in, a production processing pipeline. Moreover, the three-dimensional halftone threshold matrix may be differentially generated for different desired structures, substructures and/or structural blends without needing modification of the digital representation of the three-dimensional object. This enables flexibility in the design of three-dimensional objects and enables structure choices to be made near a time of production. In one case, at least one portion of the method 500 may be implemented by executable code, stored on a non-transitory storage medium, that includes instructions, that when executed by at least one processor, causes the processor to perform the at least one portion of the method 500 described herein. In another case, at least one portion of the method 500 may be implemented by at least one ASIC. The ASIC may be standard, fully customized or partially customized. In one example, the ASIC may have a structured design. The ASIC may comprise at least one microprocessor and/or at least one memory block. In another example, the ASIC may comprise at least one gate array, e.g. a field-programmable gate array. The field-programmable gate array may comprise an array of programmable logic blocks and a hierarchy of reconfigurable interconnects. The array of programmable logic blocks may, in certain examples, comprise memory elements, e.g. flip-flops. The ASIC may, in one example, be arranged to obtain the structural volume coverage representation at block 510. The ASIC may be communicatively coupled to at least one central processing unit, according to one example. The halftone threshold value may be assigned at block 520 by the at least one central processing unit. The at least one central processing unit may comprise at least one of a general-purpose central processing unit and a specific-purpose central processing unit.

Figure 6:
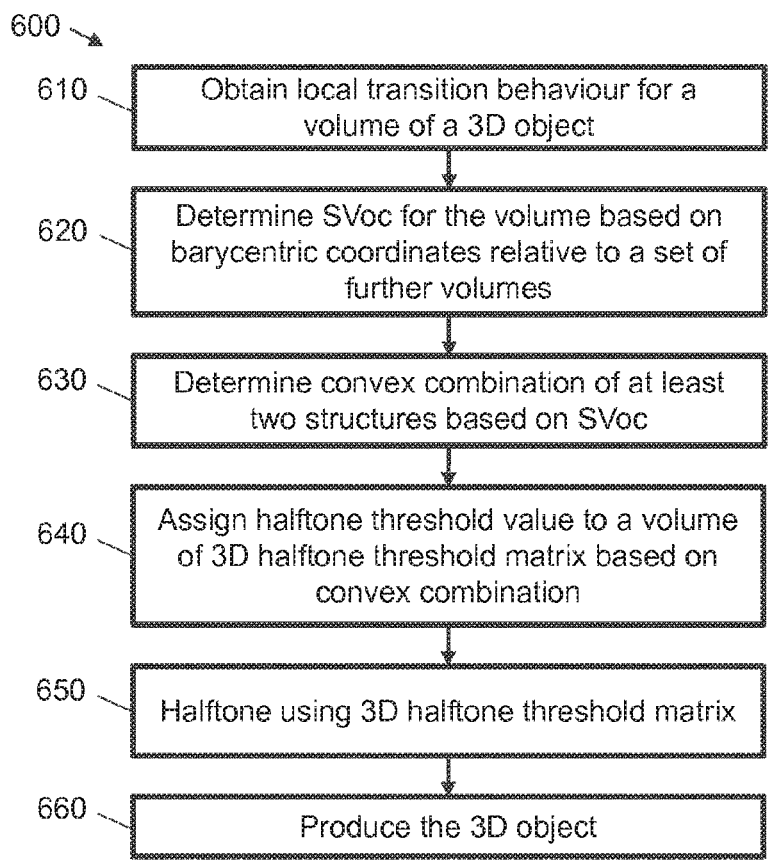
FIG. 6 is a flow diagram showing a method for producing a three-dimensional object according to an example.

FIG. 6 shows a method 600 for generating a three-dimensional halftone threshold matrix for use in production of a three-dimensional object according to an example. This method may be applied by any one of apparatus 100 and deposit controller 220, by another additive manufacturing system or by a computer device arranged to control an additive manufacturing system. The method begins with a digital representation for the three-dimensional object, e.g. this may be obtained in a pre-processing step. The digital representation may comprise at least one material volume coverage vector for at least one volume of the three-dimensional object or another material-use definition. At block 610, a given volume of the three dimensional object is selected and a local transition behavior for the given volume is obtained. In one case, blocks 610 to 640 may be repeated for each defined volume of the digital representation, e.g. for each input voxel. In one example, the local transition behavior may be based on at least one value from a transition matrix. The local transition behavior may, according to another example, be based on a predefined transition function. This function may be embodied in computer program code and/or processing electronics that is selectively applied to data comprising matrix values. The predefined transition function may be predefined between the positions of at least two further volumes, e.g. between at least two points in the three-dimensional space of the object. In one example, the predefined transition function may be a logarithmic, polynomial or exponential function. In another example, the predefined transition function may be a combination of various functions. The local transition behavior may, in certain examples, be based on a spatial tessellation. In one such example, the local transition behavior may be based on a spatial tessellation with linear tetrahedral interpolation. In certain cases, the local transition behavior may comprise applying particular computer program code and/or processing electronics.

At block 620, a structural volume coverage representation is obtained for the three-dimensional object. The structural volume coverage representation may be based on the obtained local transition behavior obtained at block 610. For example, local transition behavior may be obtained for each of a plurality of voxels and this may be used to generate structural volume coverage vector ("SVoc") values for each of the plurality of voxels. In the example of FIG. 6, the structural volume coverage representation obtained at block 620 may be based on a set of barycentric co-ordinates determined for a particular given volume relative to a set of the at least two further volumes, i.e. positions in three dimensional space. In one example, the structural volume coverage representation may be based on a set of barycentric coordinates determined for the given volume relative to a set of four further volumes. The four further volumes may be representative of the vertices of a three-dimensional simplex. In another example, the further volumes may be representative of faces and/or edges relative to vertices of a three-dimensional simplex. The structural volume coverage representation comprises a structural volume coverage vector, SVoc, for at least one volume, representing a proportional volumetric coverage of at least two different matrices. In one example, the structural volume coverage vector may comprise a set of data values indicative of probabilities, each probability corresponding to one of the at least two structural threshold matrices available for a halftone operation for the production of the three-dimensional object. In one case, values for structural volume coverage vectors may be generated based on a gradient between values of the at least two different structural matrices at the at least two further volumes. In other words, the at least two further volumes may be considered as structural absolutes, between which a transitional region exists. For example, if there are four structural matrices ($SM_i$) representative of four different available structures and the local transition behavior is defined as a spatial tessellation with linear tetrahedral interpolation, e.g. between defined vertices and/or points in each structural matrix, then, for a location [x, y, z], a structural volume coverage vector may be computed as the barycentric coordinates [$a_1$, $a_2$, $a_3$, $a_4$] in the structural tessellation such that the values for the components of the structural volume coverage vector are [S1: $a_1$, S2: $a_2$, S3: $a_3$, S4: $a_4$], wherein components S1 to S4 relate to respective matrices $SM_1$ to $SM_4$.

The structural tessellation may be considered as a geometric tessellation of spatial locations whose vertices have associated structural matrices. For an illustrative example, let there be two structural matrices, $SM_1$ and $SM_2$, to be applied over a cube object. At each of the eight cube vertices one of the two structural matrices may be explicitly defined as having 100% coverage (or 100% probability). For example, $SM_1$ may have 100% coverage at vertices [0 0 0], [0 1 0], [1 0 0] and [1 1 0] (e.g. the bottom face of the cube), and $SM_2$ may have 100% coverage at vertices [0 0 1], [0 1 1], [1 0 1] and [1 1 1] (e.g. the top face of the cube). A Delaunay tessellation may be generated for this space, creating a structural tessellation (e.g. a tetrahedralization) where in each case at least one of the vertices is different from the other three. For example, a tetrahedron may be generated such that [0 0 0], [1 0 0], [1 0 1] and [1 1 0] are its vertices, in which case three vertices use $SM_1$ and one uses $SM_2$. Any point within the aforementioned structural tessellation (e.g. tetrahedron) may be computed by means of barycentric coordinates, which will dictate the respective coverage by $SM_1$ and $SM_2$ for halftoning the object. In other words, a structural tessellation may be considered as a geometric tessellation of the locations at which structural volume coverage is defined, in order that intermediate structural volume coverage may be computed by means of interpolation.

At block 630, a convex combination of at least two structural matrices is determined, to determine a value to use for a three-dimensional halftone threshold matrix. The convex combination is based on the structural volume coverage vector for the at least one volume. In one example, at least one data value of the structural volume coverage vector may be used as a weighting for at least one matrix in the convex combination. For an example, let there be two available matrices, $SM_1$ and $SM_2$, each having different halftone threshold values. In one case these halftone threshold values for the matrices may be defined in relation to a given set of points, e.g. vertices of a cube. A given volume may be defined by co-ordinate c=[$x_c$, $y_c$, $z_c$]. The structural volume coverage vector for the given volume, may be represented as [$S_1$:$a_1$, $S_2$:$a_2$]$_c$, where $a_1$ and $a_2$ may be indicative of the probabilities associated with the use of $SM_1$ and $SM_2$, respectively, and $S_1$ and $S_2$ may denote different vector components. $a_1$ and $a_2$ may be based on a set of barycentric coordinates of the given volume relative to at least two further volumes and/or positions, each of which may be associated with at least one of the matrices $SM_1$ and $SM_2$. In one case, $a_1$ may be based on a barycentric coordinate relative to a volume and/or position associated with $SM_1$, and $a_2$ may be based on a barycentric coordinate relative to a volume and/or position associated with $SM_2$. In this case, $a_1$ and $a_2$ are convex, that is, they sum to unity. They may therefore represent convex weights. In this case, a value for a calculated structure, SC[$x_c$, $y_c$, $z_c$], for the given volume (e.g. at a location corresponding to the co-ordinate), may be represented as SC[$x_c$, $y_c$, $z_c$]=$a_1$*$SM_1$[$x_c$, $y_c$, $z_c$]+$a_2$*$SM_2$[$x_c$, $y_c$, $z_c$] i.e. a weighted combination of the halftone threshold values of the available matrices $SM_1$ and $SM_2$ at the co-ordinate [$x_c$, $y_c$, $z_c$], where $a_1$ and $a_2$ the convex weights. In a more general case, for N available structural matrices, the structural volume coverage vector for a given volume defined by co-ordinate [$x_c$, $y_c$, $z_c$] may be represented as [$S_1$:$a_1$, $S_2$:$a_2$, $S_3$:$a_3$, . . . $S_N$:$a_N$]$_c$, where $a_1$, $a_2$, $a_3$, . . . $a_N$ may be indicative of the probabilities associated with the use of $SM_1$, $SM_2$, $SM_3$, . . . $SM_N$ respectively. In this case, $a_1$, $a_2$, $a_3$, . . . $a_N$ may be convex, that is, they sum to unity. A calculated structure, SC, for the given volume, may be represented more generally as SC[$x_c$, $y_c$, $z_c$]= $a_1$*$SM_1$[$x_c$, $y_c$, $z_c$]+$a_2$*$SM_2$[$x_c$, $y_c$, $z_c$]+$a_3$*$SM_3$[$x_c$, $y_c$, $z_c$]+ . . . +$a_N$*$SM_N$[$x_c$, $y_c$, $z_c$], i.e. a weighted combination of the halftone threshold values of the available structural matrices $SM_1$, $SM_2$, $SM_3$, . . . $SM_N$ at the co-ordinate [$x_c$, $y_c$, $z_c$]. The weighted combination, SC[$x_c$, $y_c$, $z_c$], may be a value within a same range as the values $SM_1$[$x_c$, $y_c$, $z_c$], $SM_2$[$x_c$, $y_c$, $z_c$], $SM_3$[$x_c$, $y_c$, $z_c$], . . . $SM_N$[$x_c$, $y_c$, $z_c$], provided that the values $a_1$, $a_2$, $a_3$, . . . $a_N$ are convex. In one case, the same range may be between 0 and 4095, e.g. for a 12 bit matrix.

At block 640, a halftone threshold value is assigned to a volume of the three-dimensional halftone threshold matrix. The halftone threshold value is based on the convex combination performed at block 630, and corresponds to the calculated structure for the volume, SC[$x_c$, $y_c$, $z_c$]. Therefore the halftone threshold value may indicate at least a portion of at least one of the available structural matrices. For example, let a structural volume coverage vector for a given volume be represented as [$S_1$:0.5, $S_2$:0.5]. The convex combination for this structural volume coverage vector may result in a halftone threshold value which is indicative of equally weighted threshold components from both matrices $SM_1$ and $SM_2$ at the co-ordinate [$x_c$, $y_c$, $z_c$]. If the threshold components of $SM_1$ and $SM_2$ at the co-ordinate [$x_c$, $y_c$, $z_c$] are not equal, the resulting halftone threshold value may be different than that which would result if either $SM_1$ or $SM_2$ were selected and/or used individually for the given volume. Said volume of the three-dimensional halftone threshold matrix may correspond to the volume associated with the structural volume coverage vector used for the convex combination at block 630, e.g. the volume may be defined by co-ordinate [$x_c$, $y_c$, $z_c$] in both matrices.

Blocks 610 to 640 may be repeated for each of a plurality of voxels (e.g. for multiple co-ordinates) to generate a complete three-dimensional halftone threshold matrix having threshold values for each of the voxels. In the present example, at block 650, the digital representation for the three-dimensional object is halftoned using the generated three-dimensional halftone threshold matrix based on the halftone threshold values assigned in block 640. The halftoning operation generates control data for production of the three-dimensional object. At block 660, the three-dimensional object is produced on an additive manufacturing system using the generated control data.

In one case, a digital representation of a three-dimensional object may be at least derived from three-dimensional object model data received in a vector-based format, e.g. data from a STereoLithography ".stl" file. In certain cases this may be converted to a predetermined raster resolution. Vector-based formats represent a three-dimensional object using defined model geometry, such as meshes of polygons and/or combinations of three-dimensional shape models. For example, a ".stl" file may comprise a vector representation in the form of a list of vertices in three dimensions, together with a surface tessellation in the form of a triangulation or association between three vertices. The raster representation may comprise a plurality of defined unit voxels or custom voxels, e.g. defined volumes of at least one size.

Figure 7:
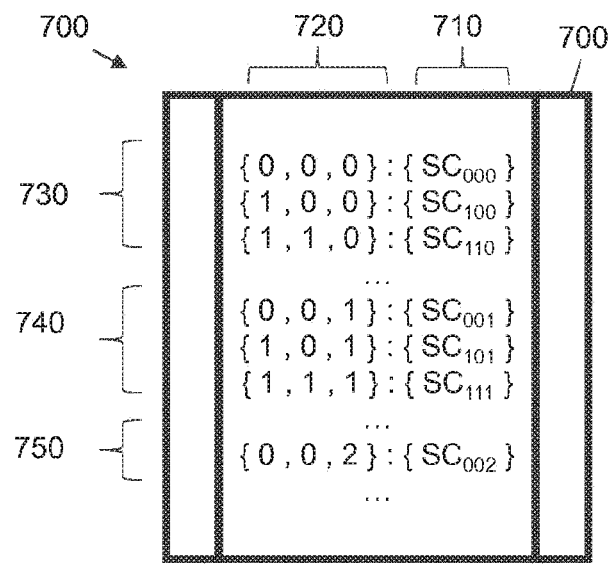
FIG. 7 is a schematic diagram showing an electronic data structure for use in three-dimensional halftoning according to an example.

FIG. 7 shows an electronic data structure 700 for use in three-dimensional halftoning according to an example. The electronic data structure 700 may be stored in a non-transitory computer-readable storage medium, such as volatile memory, non-volatile memory and magnetic or solid state storage, amongst others. The non-transitory computer-readable storage medium may be arranged to store computer program code, e.g. in the form of firmware. Firmware may comprise machine readable instructions and/or executable code that includes instructions. In FIG. 7, the electronic data structure 700 comprises data values 710 defined in association with a plurality of co-ordinates 720 in three-dimensional space. As shown, the co-ordinates being defined according to a grid resolution in x, y and z dimensions, e.g. may comprise the centers or corners of voxels defined according to a predetermined resolution or set of discrete values in each of the x, y and z dimensions. In FIG. 7, the data values 710 comprise threshold values for a three-dimensional halftone operation. They are representative of a plurality of z-dimension planes arranged parallel to the x and y dimensions, e.g. as shown by groupings 730, 740 and 750 in FIG. 7. Grouping 730 has a first common z co-ordinate value ("0"); grouping 740 has a second common z co-ordinate value ("1"); and grouping 750 has a third common z co-ordinate value ("2"). This may be repeated for multiple z-layers. At least one of the data values 710 comprises an indication of a determined spatial structure. The determination is based on a convex combination of at least two different predefined spatial structures weighted by a probabilistic distribution of the at least two different predefined spatial structures obtained for the co-ordinates associated with said data value 710. As an example shown in FIG. 7, the co-ordinates in grouping 730 have data values indicative of determined spatial structures "$SC_{000}$", "$SC_{100}$" and "$SC_{110}$", respectively. The co-ordinates in grouping 740 have data values indicative of determined spatial structures "$SC_{001}$", "$SC_{101}$" and "$SC_{111}$", respectively. Each of the determined structures may comprise at least a portion of at least one of the predefined spatial structures. The determined structures may, in one case, be separately determined for each given co-ordinate, e.g. by calculating a convex combination of the predefined spatial structures at that co-ordinate. In another case, the determined structures "$SC_{000}$", "$SC_{100}$" and "$SC_{110}$" may be obtained from a single structural matrix, SC. Hence, the electronic data structure 700 of FIG. 7 may be used to store a three-dimensional halftone threshold matrix for use by the halftone generator 110 of FIG. 1 or for use in the method of FIG. 5.

FIG. 7 is shown for example and other formats may be used to store the data values of the electronic data structure. For example, a compact representation of the electronic data structure 700 may alternatively comprise: a definition of a width, depth and height of a three-dimensional halftone threshold matrix; an indicated order for traversing the matrix; and the sequence of data values 710 comprising the threshold values. In this case the plurality of co-ordinates 720 may not be explicitly encoded; these would be implicitly encoded through the other indicated parameters.

Figure 8:
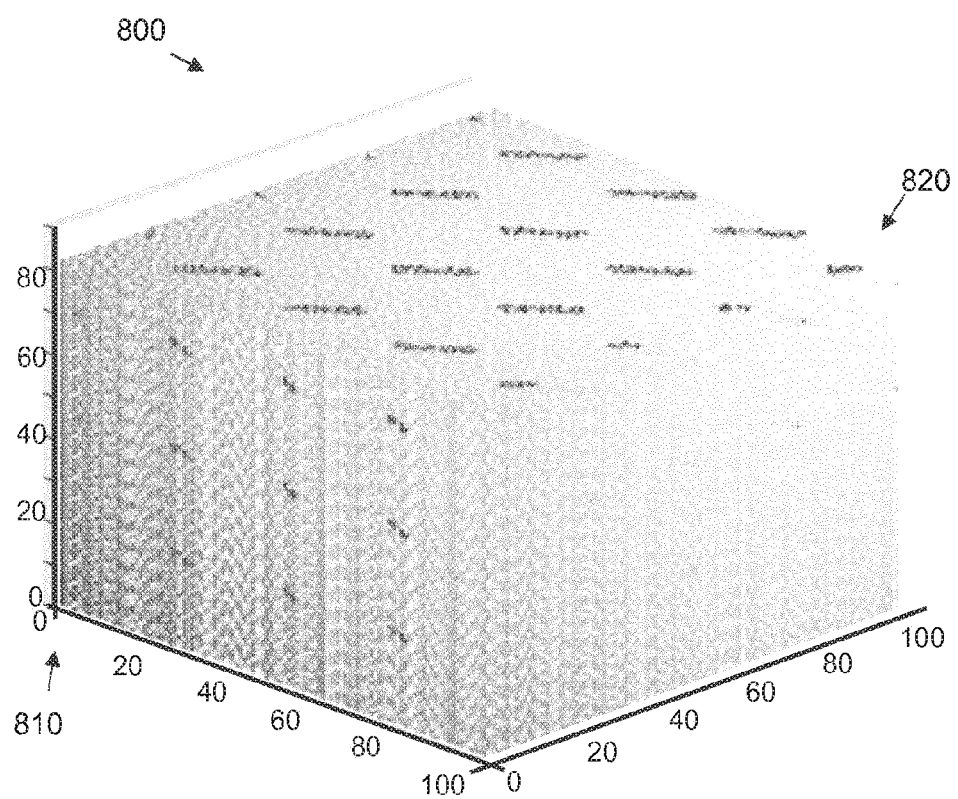
FIG. 8 is an illustration of an example three-dimensional halftone matrix.

FIG. 8 shows an example graphic output of a simulation of a three-dimensional halftone matrix 800 as may be produced using the examples described herein. For example, the three-dimensional halftone matrix may comprise a versions of the three-dimensional threshold matrix 150 in FIG. 1. The example matrix 800 comprises a blend or mixture of two different structures. A first structure comprises a two-dimensional blue-noise halftone matrix that is distributed over three-dimensions. A second structure comprises a blue-noise-seeded organic lattice (Hart 10-3) defined in three-dimensions. Each of the two structures are defined by a respective three-dimensional halftone threshold matrix. The example matrix 800 has a transition using a cubic distance function along a diagonal [0, 0, 0] to [100, 100, 100], and uses a weighted convex combination blending metric. For example, the first structure has a probability of 100% and the second structure has a probability of 0% at co-ordinate [0, 0, 0], indicated in FIG. 8 by 810. The second structure then has a probability of 100% and the first structure has a probability of 0% at [100, 100, 100], indicated in FIG. 8 by 820. The darker linear portions as seen at the top of the graphic output may be considered to arise from the second structure and the diffuse noise-like portions of the graphic output may be considered to arise from the first structure 820.

Certain system components and methods described herein may be implemented by way of computer program code that is storable on a non-transitory storage medium. The computer program code may be implemented by a control system comprising at least one processor that can retrieve data from a computer-readable storage medium. The control system may comprise part of an object production system such as an additive manufacturing system. The computer-readable storage medium may comprise a set of computer-readable instructions stored thereon. The at least one processor may be configured to load the instructions into memory for processing. The instructions are arranged to cause the at least one processor to perform a series of actions. The instructions may instruct the method 500 of FIG. 5 and/or any other of the blocks or processes described herein. The non-transitory storage medium can be any media that can contain, store, or maintain programs and data for use by or in connection with an instruction execution system. Machine-readable media can comprise any one of many physical media such as, for example, electronic, magnetic, optical, electromagnetic, or semiconductor media. More specific examples of suitable machine-readable media include, but are not limited to, a hard drive, a random access memory (RAM), a read-only memory (ROM), an erasable programmable read-only memory, or a portable disc.

Certain examples described herein enable a digital representation of a three-dimensional object, e.g. a three-dimensional raster representation, to be halftoned in a manner to generate a mixture or blend of multiple structures within the three-dimensional object, wherein that mixture or blend may be seen as "smooth", i.e. discontinuities may be below a specified threshold. This results in a three-dimensional object with varying structural properties in a manner that minimizes discontinuities, e.g. abrupt changes in construction, between different parts or volumes of the object. This is achieved by providing an apparatus and method for generating a three-dimensional threshold matrix that may be applied to the digital representation. A structural volume coverage representation is obtained, comprising data values defining a probabilistic distribution of at least two different structural representations for at least one volume element of the three-dimensional object. The structural volume coverage representation may be based on a transition function predefined between the positions of at least two further volume elements of the three-dimensional object. A convex combination of the at least two structural representations is determined for the at least one volume element based on at least one of said data values of the structural volume coverage representation. Based on the convex combination determined, a halftone value is assigned to at least one corresponding volume element of the three-dimensional matrix. The halftone value may indicate a calculated structure comprising at least a portion of one of said structural representations. Through the use of the structural volume coverage representation, a single mechanism applicable to any arbitrary number of predefined structures may be applied at the halftone level, without the need for design-stage modifications of sub-structure which may be computationally expensive.

Certain examples also enable structural control to be applied to the generation of a three-dimensional object in a manner that is computationally efficient and may be parallelized. By using a structural volume coverage representation, individual halftone structure labels may be applied to different parts of an object to provide an efficient encoding of structural properties. By using certain examples described herein this encoding further enables a control over material structure in a continuous manner. For example, one part of an object may comprise a two-dimensional blue-noise halftone matrix distributed over three-dimensions and another part of an object may comprise a blue-noise-seeded organic lattice defined in three-dimensions; the presently described examples may thus be used to provide a transition between the two different structures in the object. In certain examples, blending of two different structures is achieved by defining a gradient or transition function, which may be defined as an input for an object to be produced (and/or for parts of said object). In certain examples, the gradient or transition function is used to define the structural volume coverage representation that may then be processed in an operation similar to halftoning to generate a three-dimensional threshold matrix for halftoning material usage values associated with the object. By doing this blending geometry (e.g. as defined by the convex combination calculation) may be decoupled from gradient geometry, e.g. as represented in the structural volume coverage vectors generated from a transition function. A blended structure obtained based on a convex combination of predefined constituent structures may exhibit a structurally-continuous effect, i.e. the blended structure may be different from any of the constituent structures not only at the object-scale, but also at the level of individual printed voxels.

Certain examples described herein enable a three-dimensional object to be produced with an explicitly controlled blending of multiple structures. The examples described modify a halftone output that is used for the production of three-dimensional objects, e.g. in an additive manufacturing system, through the use of a halftoning-based structure control mechanism. Although for ease of explanation in certain cases, use of a single production material has been described, the examples described herein may be expanded to a multi-material, e.g. with a plurality of production materials, including combinations of production materials.

The preceding description has been presented to illustrate and describe examples of the principles described. This description is not intended to be exhaustive or to limit these principles to any precise form disclosed. Many modifications and variations are possible in light of the above teaching. Techniques, functions and approaches described in relation to one example may be used in other described examples, e.g. by applying relevant portions of that disclosure.

What is claimed is:

1. An apparatus to generate control data for production of a three-dimensional object comprising:
a halftone generator to apply a halftoning operation to a digital representation of the three-dimensional object, the halftone generator being arranged to process the data defining the three-dimensional object in association with a three-dimensional threshold matrix to output discrete material formation instructions for at least one production material; and
a matrix generator to generate the three-dimensional threshold matrix for use by the halftone generator, the matrix generator being arranged to:
obtain a structural volume coverage representation defined with reference to at least one volume element corresponding to the three-dimensional object, the structural volume coverage representation comprising data values defining a probabilistic distribution of at least two different predefined structures available for the production of the three-dimensional object;
determine, for the at least one volume element, a convex combination of the at least two predefined structures based on at least one of said data values of the structure volume coverage representation; and
assign a data value to at least one corresponding volume element of the three-dimensional threshold matrix based on the convex combination determined.

2. The apparatus according to claim 1,
wherein the structural volume coverage representation comprises at least one structural volume coverage vector having at least two vector components corresponding to the at least two predefined structures, the structural volume coverage vector corresponding to at least a first volume element in a set of volume elements; and
wherein the matrix generator is arranged to obtain data values for the at least two vector components based on a determined transition behavior among the at least two predefined structures for a position associated with the first volume element,
wherein said transition behavior is determined based on a transition function predefined between the positions of at least two further volume elements of the set of volume elements.

3. The apparatus according to claim 2, wherein the transition behavior is based on a determined distance metric between the position of the first volume element and the positions of the at least two further volume elements.

4. The apparatus according to claim 1, wherein the matrix generator is arranged to assign to at least one volume element a data value indicating a calculated structure, the calculated structure comprising at least a portion of one of said predefined structures.

5. The apparatus according to claim 2, wherein the transition behavior is based on a spatial tessellation with tetrahedral interpolation.

6. The apparatus according to claim 1, comprising:
a deposit mechanism, communicatively coupled to the halftone generator, to deposit available production materials according to the discrete material formation instructions output by the halftone generator.

7. The apparatus according to claim 1,
wherein the data defining the three-dimensional object comprises at least one material volume coverage vector for at least one volume of the three-dimensional object,
wherein, for k materials available for production of the three-dimensional object and L discrete material formation states for said materials, the material coverage vector comprises $L^k$ vector components, each vector component having an associated probability value,
wherein the halftone generator is arranged to perform a halftoning operation on the at least one material volume coverage vector, and
wherein the discrete material formation instructions comprise production instructions from a set of L*k available instruction values, each element at a production resolution having one of L material formation state instructions for each of said k materials.

8. A method for generating a three-dimensional halftone threshold matrix for use in production of a three-dimensional object, comprising:
obtaining a structural volume coverage representation for the three-dimensional object,
the structural volume coverage representation comprising a structural volume coverage vector for at least one volume of the three-dimensional object,
the structural volume coverage vector representing a proportional volumetric coverage of at least two different predefined matrices; and
assigning a halftone threshold value to a corresponding volume of the three-dimensional halftone threshold matrix based on a weighted combination of the at least two predefined matrices, the halftone threshold value corresponding to at least a portion of at least one of said predefined matrices; and
wherein the three-dimensional halftone threshold matrix is applicable to an object definition for the three-dimensional object to instruct production of the three-dimensional object.

9. The method according to claim 8, wherein obtaining a structural volume coverage representation comprises determining, for the at least one volume, a local transition behavior based on a predefined transition function,
wherein said transition function is predefined between the positions of at least two further volumes.

10. The method according to claim 8, wherein a structural volume coverage representation comprises determining, for the at least one volume, a set of barycentric coordinates relative to a set of at least two further volumes of the three-dimensional object.

11. The method according to claim 9, wherein the local transition behavior is based on a spatial tessellation with tetrahedral interpolation.

12. The method according to claim 10, wherein the assigning the halftone threshold value comprises obtaining at least two convex weights based on said set of barycentric coordinates.

13. The method of claim 8, comprising:
obtaining a digital representation for the three-dimensional object;
halftoning the digital representation using the three-dimensional halftone threshold matrix to generate control data for production of the three-dimensional object; and
producing the three-dimensional object on an additive manufacturing system using the generated control data.

14. The method of claim 13,
wherein the digital representation comprises at least one material volume coverage vector for at least one volume of the three-dimensional object,
wherein, for k materials available for production of the three-dimensional object and L discrete material formation states for said materials, the material coverage vector comprises $L^k$ vector components, each vector component having an associated probability value,
wherein halftoning is performed on the at least one material volume coverage vector, and
wherein the control data comprises discrete production instructions from a set of L*k available instruction values, each element at a production resolution having one of L material formation state instructions for each of said k materials.

15. A non-transitory machine readable medium comprising an electronic data structure for use in three-dimensional halftoning, the electronic data structure comprising:
data values defined in association with a plurality of co-ordinates in three-dimensional space, the co-ordinates being defined according to a grid resolution in x, y and z dimensions,
wherein the data values comprise threshold values for a three-dimensional halftone operation and are representative of a plurality of z-dimension planes arranged parallel to the x and y dimensions, and
wherein at least one data value comprises an indication of a determined spatial structure,
wherein said determination is based on a convex combination of at least two different predefined spatial structures weighted by a probabilistic distribution of the at least two different predefined spatial structures obtained for the co-ordinates associated with said data value.

* * * * *